United States Patent
Lane et al.

(10) Patent No.: US 7,933,565 B2
(45) Date of Patent: Apr. 26, 2011

(54) TRANSFORMER COUPLING OF ANTENNAS

(75) Inventors: Frank Lane, Asbury, NJ (US); Rajiv Laroia, Far Hills, NJ (US); Per Kristensen, Ocean Township, NJ (US)

(73) Assignee: QUALCOMM, Incorporated, San Diego, CA (US)

( * ) Notice: Subject to any disclaimer, the term of this patent is extended or adjusted under 35 U.S.C. 154(b) by 824 days.

(21) Appl. No.: 11/486,747

(22) Filed: Jul. 14, 2006

(65) Prior Publication Data

US 2008/0013443 A1 Jan. 17, 2008

(51) Int. Cl.
*H04B 1/02* (2006.01)
(52) U.S. Cl. ............... 455/103; 455/7; 455/19; 455/95; 340/7.49; 340/825.73; 379/51
(58) Field of Classification Search .................. 455/103, 455/7, 19, 95; 340/7.49, 825.73; 379/51
See application file for complete search history.

(56) References Cited

U.S. PATENT DOCUMENTS

| | | | |
|---|---|---|---|
| 3,731,200 A * | 5/1973 | Schwendeman et al. .... | 340/7.49 |
| 3,815,030 A | 6/1974 | Morrison | |
| 3,852,530 A * | 12/1974 | Shen ................................. | 381/2 |
| 4,523,178 A * | 6/1985 | Fulhorst .................... | 340/426.13 |
| 4,580,111 A * | 4/1986 | Swanson ........................ | 332/152 |
| 4,677,655 A * | 6/1987 | Hashimoto ................ | 455/412.1 |
| 5,267,297 A * | 11/1993 | Kawano et al. ............... | 455/561 |
| 6,937,096 B2 | 8/2005 | Wight et al. | |
| 6,940,917 B2 | 9/2005 | Menon et al. | |
| 2005/0206490 A1 | 9/2005 | Castaneda et al. | |
| 2006/0072524 A1 * | 4/2006 | Perahia et al. ................ | 370/338 |

OTHER PUBLICATIONS

Zito D et al, "A novel fully integrated antenna switch for 5-6 GHz wireless LAN systems" Signals, Circuits and Systems, 2005, ISSCS 2005, International Symposium on Iasi, Romania Jul. 14-15, 2005, Piscataway, NJ, USA, IEEE, Jul. 14, 2005, pp. 379-382, XP010837483, ISBN: 0-7803-9029-6.
Gregorio F H et al, "Receiver Cancellation of Nonlinear Power Amplifier Distortion in SDMA-OFDM Systems," Acoustics, Speech and Signal Processing, 2006. ICASSP 2006 Proceedings. 2006 IEEE International Conference on Tolouse, France May 14-19, 2006, Piscataway, NJ, USA, IEEE, May 14, 2006, pp. IV-325, XP010931048 ISBN: 1-4244-0469-X Abstract; figure 2.
International Search Report—PCT/US07/073552, International Search Authority—European Patent Office—Mar. 5, 2008.
Written Opinion—PCT/US07/073552, International Search Authority—European Patent Office—Mar. 5, 2008.
Gregorio F H et al: "Receiver Cancellation of Nonlinear Power Amplifier Distortion in SDMA-OFDM Systems" Coustics, Speech and Signal Processing, 2006. ICASSP 2006 Proceedings. 2006 IEEE International Conference on.
Tolouse, France May 14-19, 2006, Piscataway, NJ, USA, IEEE, May 14, 2006, pp. IV-325, XP010931048 ISBN: 1-4244-0469-X Abstract; figure 2.
Zito D et al: "A novel fully integrated antenna switch for 5-6 GHz wireless LAN systems" Signals, Circuits and Systems, 2005. ISSCS 2005. International Symposium on IASI, Romania Jul. 14-15, 2005, Piscataway, NJ, USA, IEEE, Jul. 14, 2005, pp. 379-382, XP010837483 ISBN: 0-7803-9029-6 figures 2, 3.

* cited by examiner

*Primary Examiner* — Sanh D Phu
(74) *Attorney, Agent, or Firm* — Sandip S. Minhas; Ramin Mobarhan

(57) ABSTRACT

Embodiments describe improved coupling of power amplifiers to antennas for the transmission of signals, such as OFDM signals. A large number of separate windings are utilized on a primary side, wherein each winding is for a different OFDM tone. Each OFDM tone may be amplified individually and combined as a results of transformer coupling. For example, the secondary side can have a single winding that combines the different OFDM tones.

18 Claims, 9 Drawing Sheets

TRANSFORMER COUPLING OF ANTENNAS

BACKGROUND

I. Field

The following description relates generally to wireless communication and more particularly to transmitting wireless signals.

II. Background

Communications systems frequently include a plurality of network nodes, which are coupled to access nodes through which end nodes (e.g., mobile devices) are coupled to the network. Network nodes may be arranged in a hierarchy. End nodes typically communicate with access nodes directly through connections that have been established with said access nodes. Such systems usually rely on the existence of a bidirectional communications link between an access node and end node to support two-way communications between an end node and an access node.

In order to communicate effectively network nodes and end nodes transmit communications intended for each other through antennas. Such communication sent through an antenna needs to be transmitted with enough power that it can be heard by the intended recipient. In communication networks that communicate using a simple signal (e.g., Time Division Multiple Access (TDMA) signals), wherein the signals are nearly identical and antennas can include a singe transformer winding. However, when complex signals are involved, such as for Orthogonal Frequency Division Multiplexing (OFDM) systems, a single winding results in a complex structure that must account for a higher peak average ratio developed when the combined signals/tones are amplified. In addition, there is a need to reduce the relative loading effect with such complex signals because there is less randomness of the discrete tones, therefore, any design utilizing a single winding would have to be to a much higher voltage.

Therefore, there is a need for an antenna that can provide the necessary power for complex signals, combine signals for transmission, and minimizing a relative loading effect of the outputs of different tones on the amplifiers used to amplify the tones. In addition, there is a need for a less complex amplifier structure for amplifying the combined signals/tones.

SUMMARY

The following presents a simplified summary in order to provide a basic understanding of some aspects of the disclosed embodiments. This summary is not an extensive overview and is intended to neither identify key or critical elements nor delineate the scope of such embodiments. Its sole purpose is to present some concepts of the described embodiments in a simplified form as a prelude to the more detailed description that is presented later.

In accordance with one or more embodiments and corresponding disclosure thereof, various aspects are described in connection with improved coupling of power amplifiers to antennas. Transformer coupling is provided that combines signals for transmission and reduces a relative loading effect of the outputs of different tones on the amplifiers used to amplify other tones.

According to an embodiment is a method for combining signals for transmissions. The method includes providing a separate winding at a primary side for each tone signal. Each tone signal is amplified individually from the other tone signals. The method further includes combining each amplified signal and outputting the combined signal.

In accordance with another embodiment is an apparatus that combines signals in an OFDM communication system for transmission. The apparatus includes a voltage supply for each OFDM tone signal and a separate winding on an input side for each tone signal. An amplifier is provided for each one signal. The apparatus further includes a winding on a secondary side for coupling the tone signals. The apparatus can be included as a component in a base station or a wireless device.

In accordance with another embodiment is an apparatus that combines OFDM signals for transmission. The apparatus includes a means for utilizing a separate winding for each tone signal and a means for individually amplifying each tone signal. The apparatus further includes a means for combining the amplified tone signals and a means for transmitting the combined amplified tone signals.

To the accomplishment of the foregoing and related ends, one or more embodiments comprise the features hereinafter fully described and particularly pointed out in the claims. The following description and the annexed drawings set forth in detail certain illustrative aspects and are indicative of but a few of the various ways in which the principles of the embodiments may be employed. Other advantages and novel features will become apparent from the following detailed description when considered in conjunction with the drawings and the disclosed embodiments are intended to include all such aspects and their equivalents.

DETAILED DESCRIPTION

Figure 1:
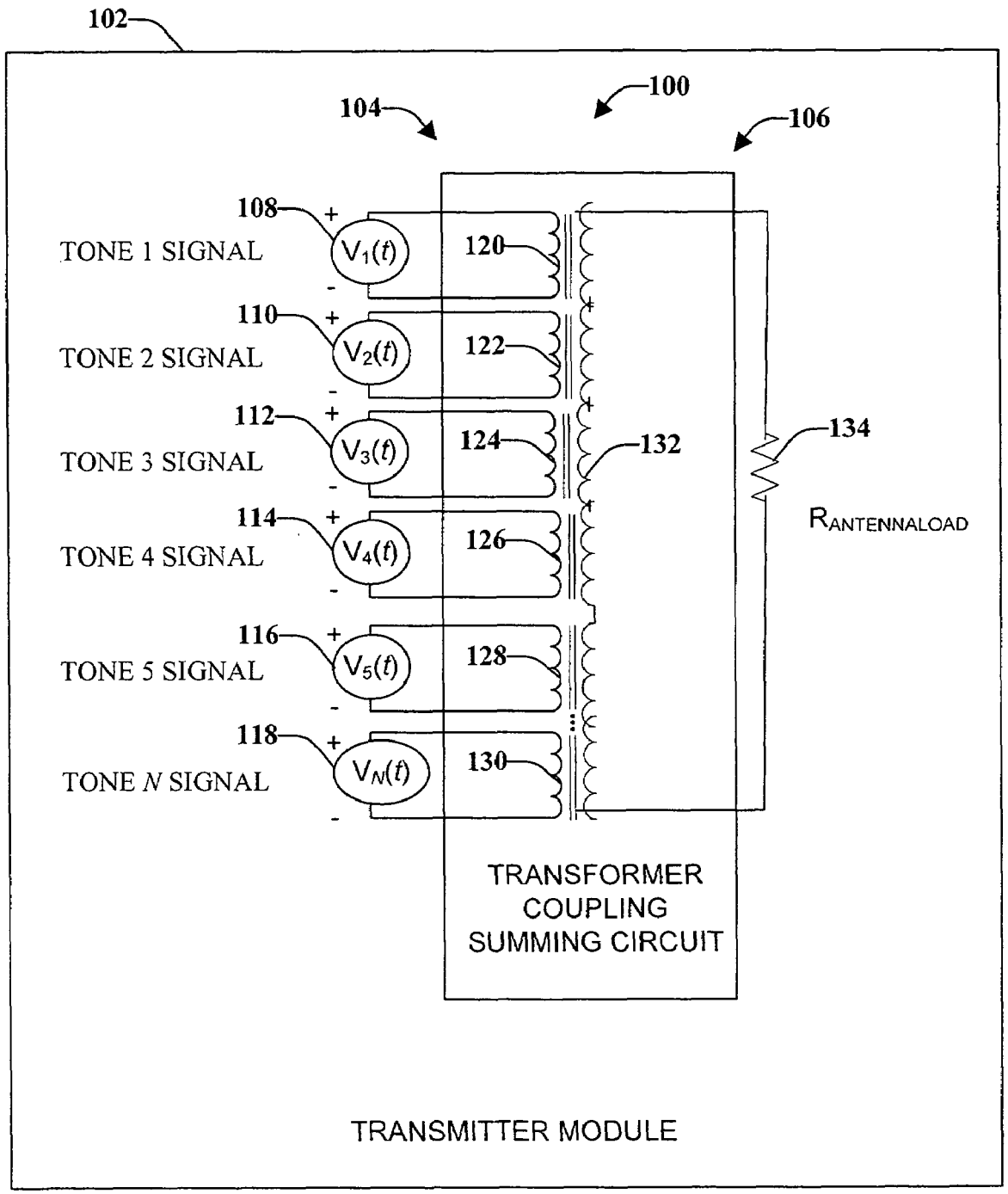
FIG. 1 illustrates a transformer coupling summing circuit in accordance with the various embodiments.

Various embodiments are now described with reference to the drawings. In the following description, for purposes of explanation, numerous specific details are set forth in order to provide a thorough understanding of one or more aspects. It may be evident, however, that such embodiment(s) may be practiced without these specific details. In other instances, well-known structures and devices are shown in block diagram form in order to facilitate describing these embodiments.

As used in this application, the terms "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Furthermore, various embodiments are described herein in connection with a user device. A user device can also be called a system, a subscriber unit, subscriber station, mobile station, mobile device, remote station, access point, base station, remote terminal, access terminal, handset, host, user terminal, terminal, user agent, wireless terminal, wireless device, or user equipment. A user device can be a cellular telephone, a cordless telephone, a Session Initiation Protocol (SIP) phone, a wireless local loop (WLL) station, a Personal Digital Assistant (PDA), a handheld device having wireless connection capability, or other processing device(s) connected to a wireless modem.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ).

Various embodiments will be presented in terms of systems that may include a number of device, components, modules, and the like. It is to be understood and appreciated that the various systems may include additional devices, components, modules, etc. and/or may not include all of the devices, components, modules etc. discussed in connection with the figures. A combination of these approaches may also be used.

With reference now to the drawings, FIG. 1 illustrates a transformer coupling summing circuit in accordance with the various embodiments. It should be understood that while the various embodiments herein are presented in terms of Orthogonal Frequency Division Multiplexing (OFDM) systems, the disclosed embodiments are not so limited and can be utilized with other communication systems.

In an exemplary communication system using OFDM technology, in the physical layer, the spectrum is divided into a number of tones and reused in cells and sectors in neighboring geographical areas. In order to improve the interference characteristics, the tones used in each cell/sector hop over time, and different cells and sectors in neighboring geographical areas use different hopping sequences, which specify how the tones shall hop. The hopping sequences are generated using a predetermined function controlled with two input variables, namely, the cell identifier (e.g., slope value) and a sector identifier. The sector identifier may be implemented as a sector type identifier that indicates to which of a plurality of possible sector types a particular sector corresponds. In one embodiment, the slope value is an integer from 1 to 112, and the sector identifier value is an integer from 0 to 5. Neighboring cells and sectors use different pairs of slope and sector identifier so that the generated hopping sequences are different. In some embodiments, all the sectors in a cell use the same slope value but different sector identifiers, and neighboring (e.g., physically adjacent) cells use different slope values.

Furthermore, the exemplary OFDM communication system, in some embodiments, uses multiple carriers or tone blocks, so that the available tones are grouped into multiple tone blocks. Tones in a tone block are preferably contiguous. In some embodiments, hopping of the tones in a given tone block is limited to that tone block. That is, the hopping sequences are such that the tones can hop within the tone block but cannot hop across multiple tone blocks. Tone blocks are indexed with a carrier identifier. In one embodiment, the carrier identifier is an integer 0, 1, or 2.

As illustrates in FIG. 1, a transformer coupling summing circuit 100 can be included in a transmitter module 102 of a base station or a wireless terminal. Transformer coupling circuit 100 includes a primary or input side 104 and a secondary or output (antenna) side 106. The primary side 104 and secondary side 106 are link by a mutual magnetic field. Transformer can have an air core, iron core, or variable core.

A multitude of OFDM tone signals can be applied to the primary side 104. Such signals are illustrated as Tone 1 Signal, Tone 2 Signal, Tone 3 Signal, Tone 4 Signal, Tone 5 Signal, and Tone N signal, wherein N can be less than or equal to 113, depending on the number of tones. A voltage source is provided for each tone signal. For example, Tone 1 signal has voltage source 108 represented as $V_1(t)$. Each tone signal has a respective voltage source 108-118, which can be voltage sources having a low impedance and/or wherein the voltage remains constant regardless of a change in current.

Each tone signal also has an independent winding 120-130 on the input side, wherein there is one winding for each OFDM tone because individual signals generally do not have commonality with another signal. On the output side, there is one winding 132, which can also be a series of windings where one winding is for each OFDM tone, connected in a series configuration. It should be noted that each tone can be at a different amplitude, a different frequency, and/or a different phase. Thus, there can be over a hundred (e.g., 113) input windings 120-130 and a single winding 132 on the secondary side 106. The different OFDM tones, which may have been amplified individually, are combined as a result of the transformer coupling and output through antenna 134. The result of such coupling is to obtain a low output impedance and the output voltage is driven based on the input signals. In such a manner, the relative loading effect of the outputs of different tones on the amplifiers utilized to amplify other tones can be reduced.

Figure 2:
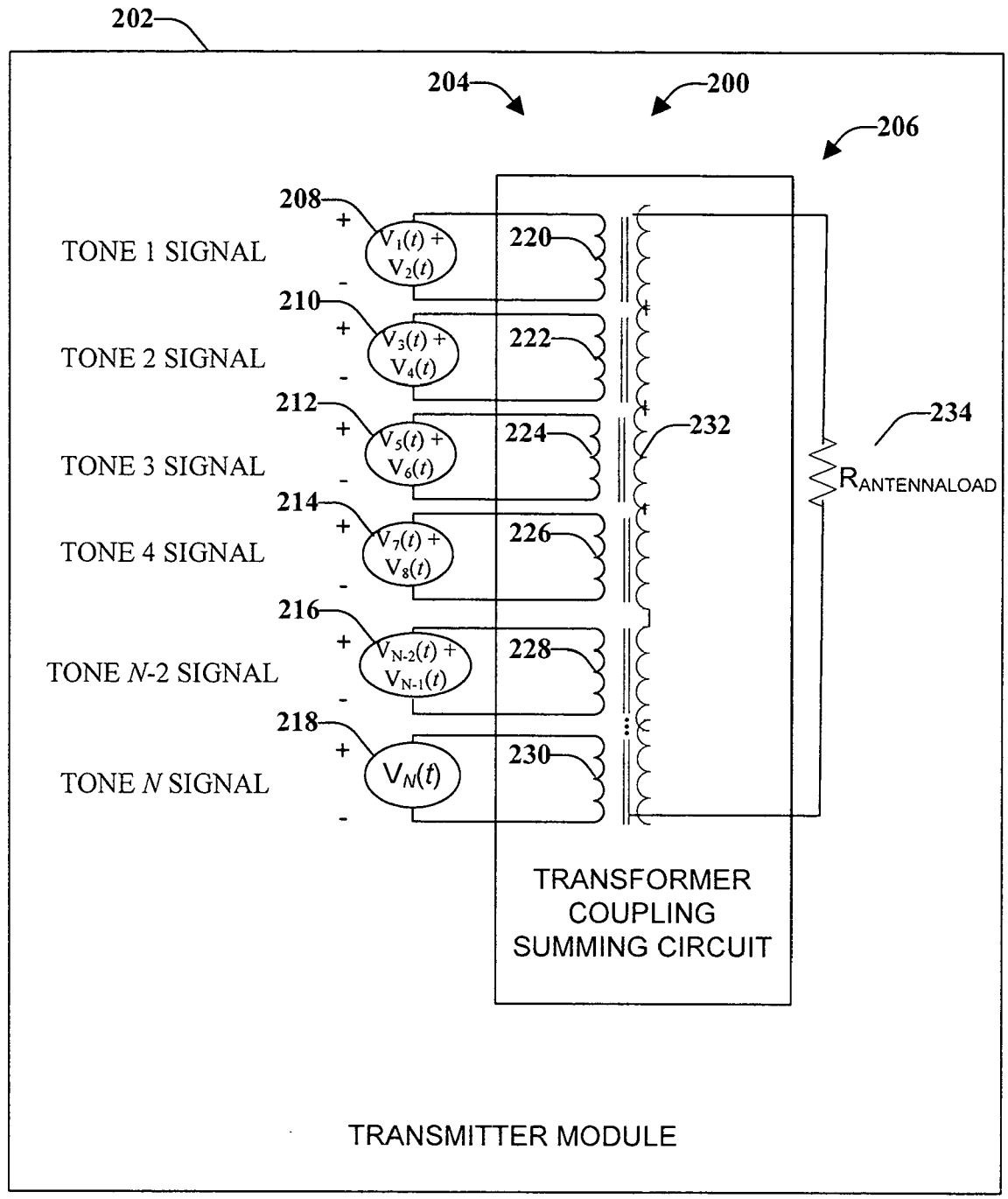
FIG. 2 illustrates another transformer coupling summing circuit in accordance with the disclosed embodiments.

FIG. 2 illustrates another transformer coupling summing circuit 200 in accordance with the disclosed embodiments. Transformer coupling summing circuit 200 is similar to that shown and described with the above figure and can be included in a transmitter module 202 of a base station or wireless terminal. Transformer circuit includes a primary side 204 and a secondary side 206.

A multitude of tones can be received, and are represented as Tone 1 Signal, Tone 2 Signal, Tone 3 Signal, Tone 4 Signal, Tone N−2 Signal, and Tone N Signal, wherein N can be equal to or less than 113. The interaction between the signals or tones is less than in systems with signals that are not as complex.

Each tone has an individual voltage supply. For example, Tone 1 Signal can have a supply voltage 108 represented as $V_1(t)+V_2(t)$. In a similar manner, Tone 2 Signal has a supply voltage 110 represented as $V_3(t)+V_4(t)$, Tone 3 Signal have a supply voltage 112 represented as $V_5(t)+V_6(t)$, and Tone 4 Signal has a voltage supply 114 of $V_7(t)+V_8(t)$. This continues with Tone N−2 Signal having a voltage supply 216 of $V_{N-2}(t)+V_{N-1}(t)$ and Tone N signal has a voltage supply 218 $V_N(t)$.

Each power supply can be coupled to an individual winding 220-230 on the primary side 204 of the transformer coupling summing circuit 200. Thus, each tone has an individual winding. Individual winding are provided to avoid coupling between the various tones. On the secondary side 206, there is a single winding 232. This single winding 232 can, alternatively or in addition, be a multitude of windings, connected in series. The output is transmitted through antenna 234 to various receiving devices.

Having individual windings on the primary side 204 and a single (or series) winding on the secondary side 206 mitigates an interaction issue common with a standard summing coupler. In such a standard summing coupler there is a positive/negative effect between the different voltages and at the output a difference between two or more signals may lost (e.g., dumped to ground).

Figure 3:
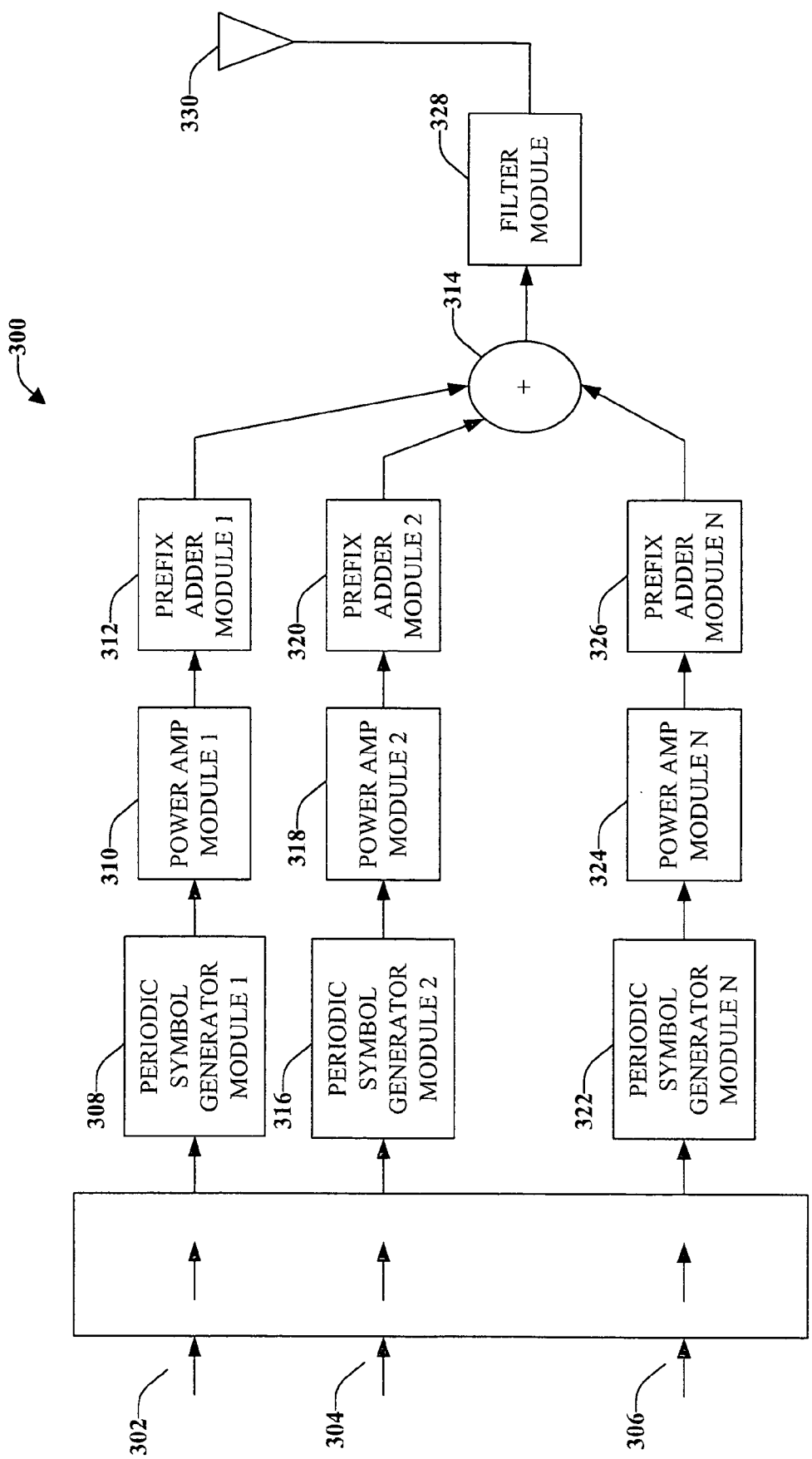
FIG. 3 illustrates another embodiment of a coupling circuit in accordance with the various embodiments.

FIG. 3 illustrates another embodiment of a coupling circuit 300 in accordance with the various embodiments. Individual OFDM tones 302, 304, 306 can be received. It should be understood that while only three tones and respective components are shown, there can be up to 113 OFDM tones and respective components in accordance with the various embodiments. Each tone can be processed individually. For example, a first tone 302 is processed through periodic symbol generator module 310, a power amplifier module 312, and a prefix adder module 314, wherein the resulting output is received at a summing circuit 316.

In a similar manner, a second tone 304 is process through an individual periodic symbol generator module 316, a power amplifier module 318, and a prefix adder module 320, wherein the resulting output is received at a summing circuit 316. Each tone is processed in a similar manner, through a respective periodic symbol generator module$_N$ 322, a power amplifier module$_N$ 324, and a prefix adder module$_N$ 326, wherein N can be any integer equal to or less than 113. The output for each circuit is received at the summing circuit 316 where the tones are combined.

The received voltages are summed together in such a manner that the uniqueness of each tone is not lost. In a standard summing coupler, there is a positive/negative effect between the different voltages and at the output, a difference between two or more signals may be lost. That is to say, if three signals are received, one being +1, a second being +1, a third being −2, the sum of the voltages equals zero and the signal might not be detected. However in the circuit illustrated in FIG. 3, each received tone is a different frequency, amplitude, and/or phrase and therefore, the separate handling of the tones mitigates coupling between the various tones, reducing the summation effect described above.

The summation of the tones is passed through a filter module 328 and output by antenna 330 to the recipient. It should be noted that the disclosed techniques can apply to a base station, a wireless terminal, or other mobile device where complex tones are to be amplified and transmitted while minimizing degradation to the signal.

Figure 4:
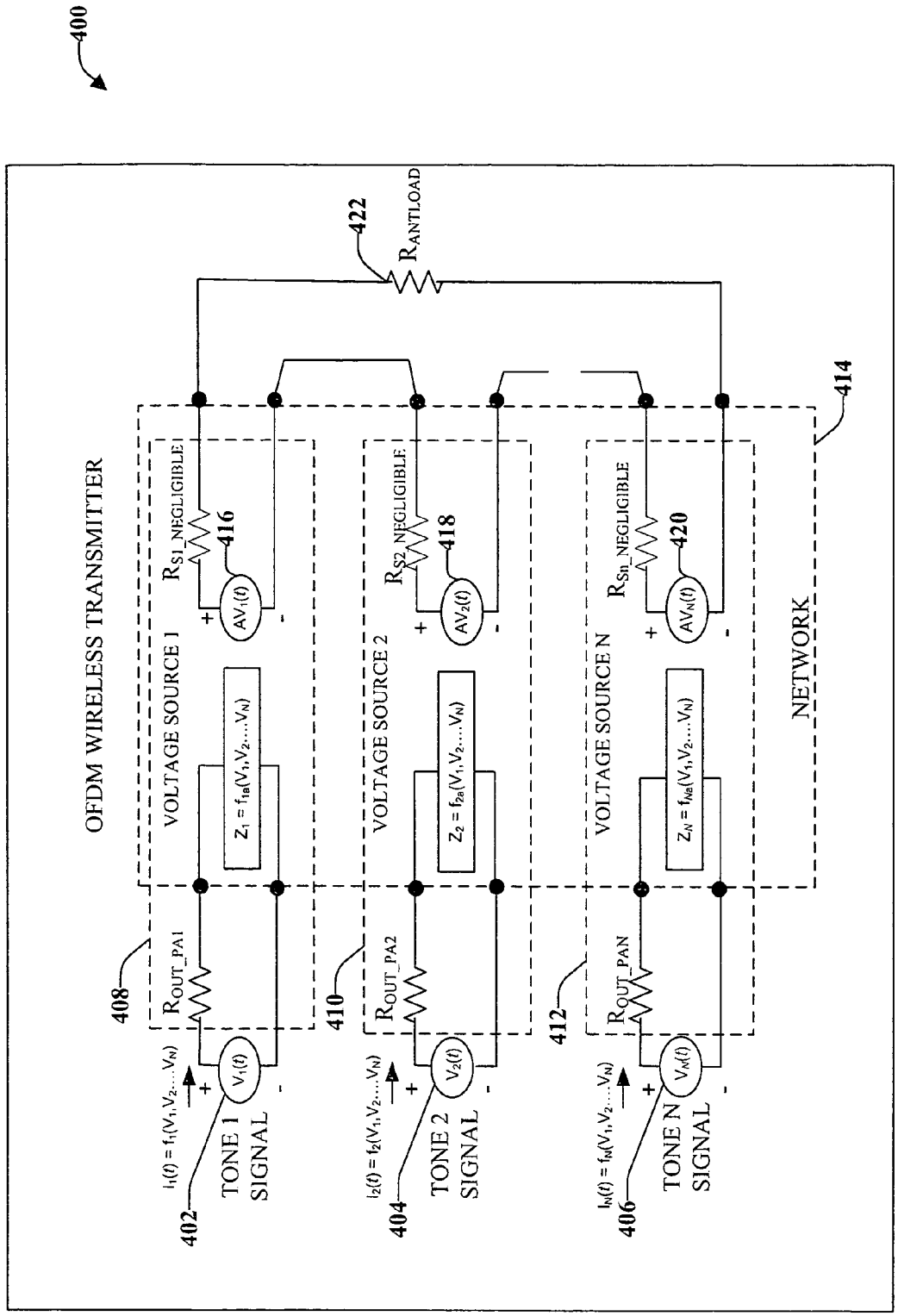
FIG. 4 illustrates an exemplary OFDM wireless transmitter utilizing the disclosed embodiments.

FIG. 4 illustrates an exemplary OFDM wireless transmitter 400 utilizing the disclosed embodiments. Individual tone signals are received, such as Tone 1 Signal, Tone 2 Signal, and Tone N Signal, where N is equal to 113, depending on the complexity of the signal received. An individual voltage source 402, 404, 406 is applied to each tone. The current flow is indicated by the respective arrows. Tone 1 Signal can have a current expressed as $I_1(t)=f_1(v_1, V_2, \ldots V_n)$. The current Tone 2 can be expressed as $I_2(t)=f_2(v_1, V_2, \ldots V_n)$. The remaining tones have a current that can be expressed in a similar manner, namely, $I_N(t)=f_N(v_1, V_2, \ldots V_n)$, where N is equal to or less than 113.

A voltage source 408, 410, 412 is applied to each tone. The voltage sources 408-412 can be near ideal voltage controlled voltage source, wherein the voltage remains fairly constant and/or the voltage source has a low impedance. The impedance of each tone signal can be expressed as $Z_N=F_{Na}(V_1, V_2, \ldots V_N)$, where N is an integer greater than or less than 113.

Each tone can be processed through a network 414, which can be, for example, a multi-transformer coupling network). Each tone can be amplified individually by respective amplifiers 416, 418, 420. Such amplification can occur in series with amplification of the other individual amplified tone and output through, for example, an antenna 422. In such a manner, the individual tones can be combined for transmission by antenna 422 while reducing the relative loading effect of the outputs of different tone on the amplifiers 416-420 used to amplify other tones.

Figure 5:
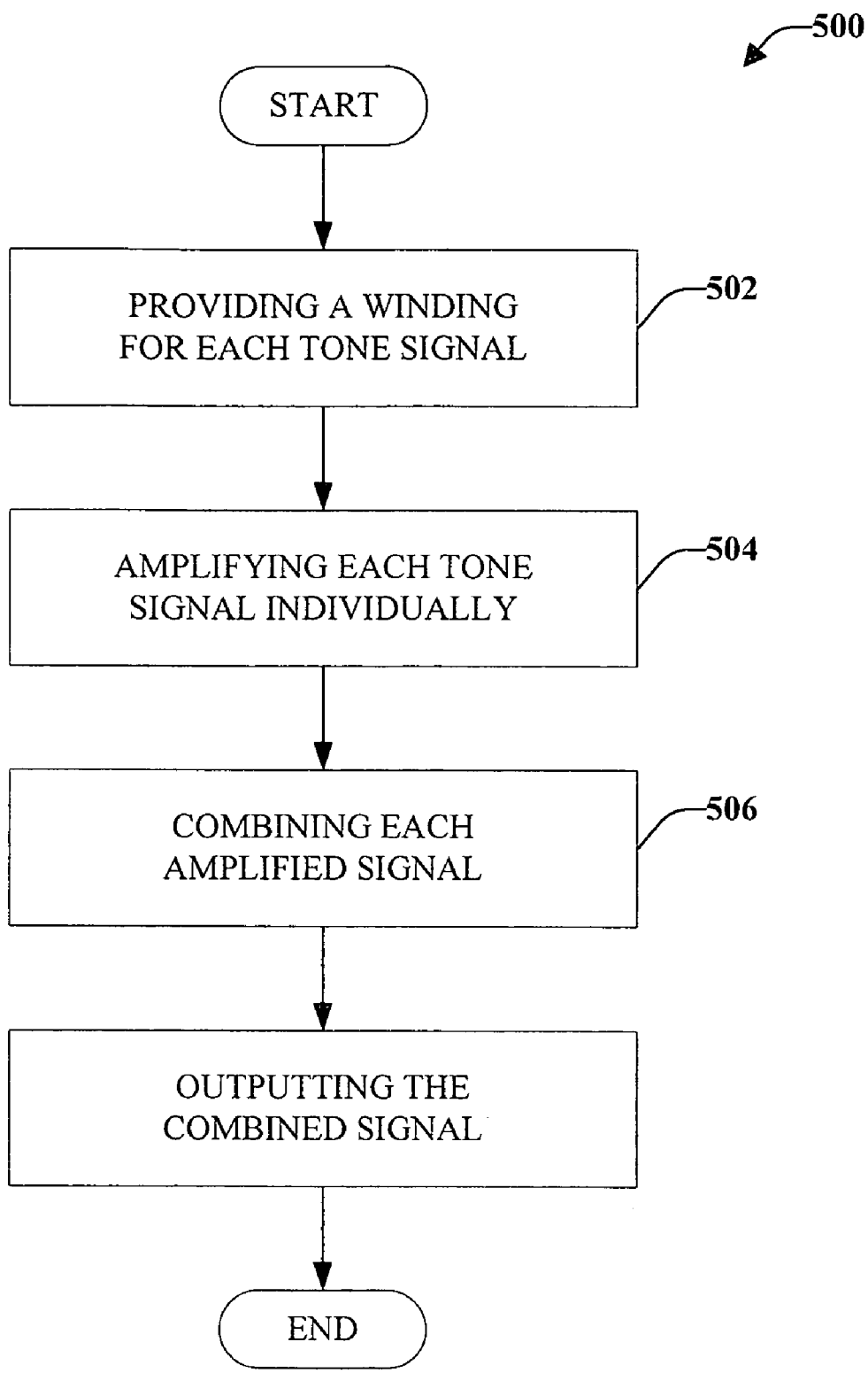
FIG. 5 illustrates a flow chart of a methodology for coupling power amplifiers to an antenna.

FIG. 5 illustrates a flow chart of a methodology 500 for coupling power amplifiers to an antenna. While, for purposes of simplicity of explanation, the methodologies are shown and described as a series of blocks, it is to be understood that the disclosed embodiments are not limited by the number or order of blocks, as some blocks may occur in different orders and/or concurrently with other blocks than what is depicted and described herein. Moreover, not all illustrated blocks may be required to implement the described methodologies. A methodology could alternatively be represented as a series of interrelated states or events, such as in a state diagram. It is to be appreciated that the functionality associated with the blocks may be implemented by software, hardware, a combination thereof or any other suitable means (e.g. device, system, process, component). Additionally, it should be appreciated that the methodologies disclosed throughout this specification are capable of being stored on an article of manufacture to facilitate transporting and transferring such methodologies to various devices.

Method 500 begins, at 502, where a transformer winding is provided for each OFDM tone. Each tone can have a different amplitude, frequency, and phrase from another signal. The windings are provided on the primary side of a transformer summing circuit. An ideal voltage source can be applied to each tone. At 504, each tone signal is amplified individually from each other tone signal. Thus, if there are 113 tone signals, there are 113 amplifications. Each signal can also have its own voltage source, which can be an ideal voltage source.

Method 500 continues at 506, where each amplified signal is combined with the other amplified signals. Such combination or summing can be the result of transformer coupling, wherein individual windings are provided for each signal on an primary side and a single winding is provided on the secondary side. The singe winding can be multiple winding arranged in a series configuration. At 508, the combined signal is output, such as through an antenna.

Figure 6:
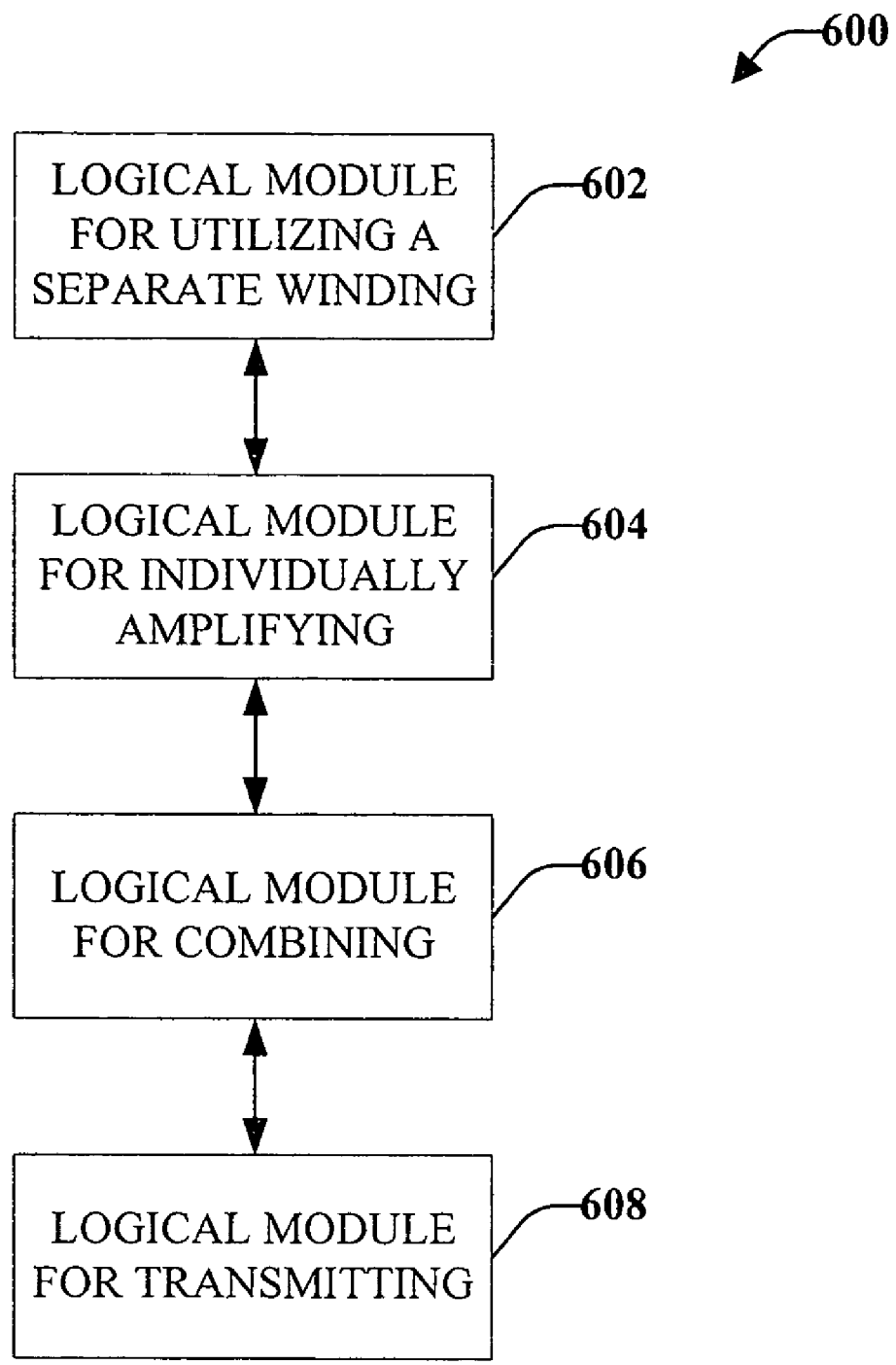
FIG. 6 illustrates a block diagram of an exemplary system in accordance with the various embodiments.

FIG. 6 illustrates a block diagram of an exemplary system 600 in accordance with the various embodiments. System 600 is represented as functional blocks, which can be functional blocks that represent functions implemented by a processor, software or combination thereof (e.g., firmware).

System 600 includes a logical module for utilizing a separate winding for each tone signal 602. The separate windings can be located on a primary side of a transformer and there can be as many windings as there are tone signals (e.g., 113).

System 600 also includes a logical module for individually amplifying each tone signal 604. A logical module for combining the amplified tone signals 606 is also included. The amplified tone signals can be combined with a single winding on a secondary side of a transformer. In accordance with some embodiments, the signals are combined utilizing a plurality of windings connected in a series configuration on the secondary side of a transformer. System also includes a logical module for transmitting the combined amplified tone signal 608. The amplified tone signal can be transmitted to a receiving device (e.g., mobile device, base station).

Figure 7:
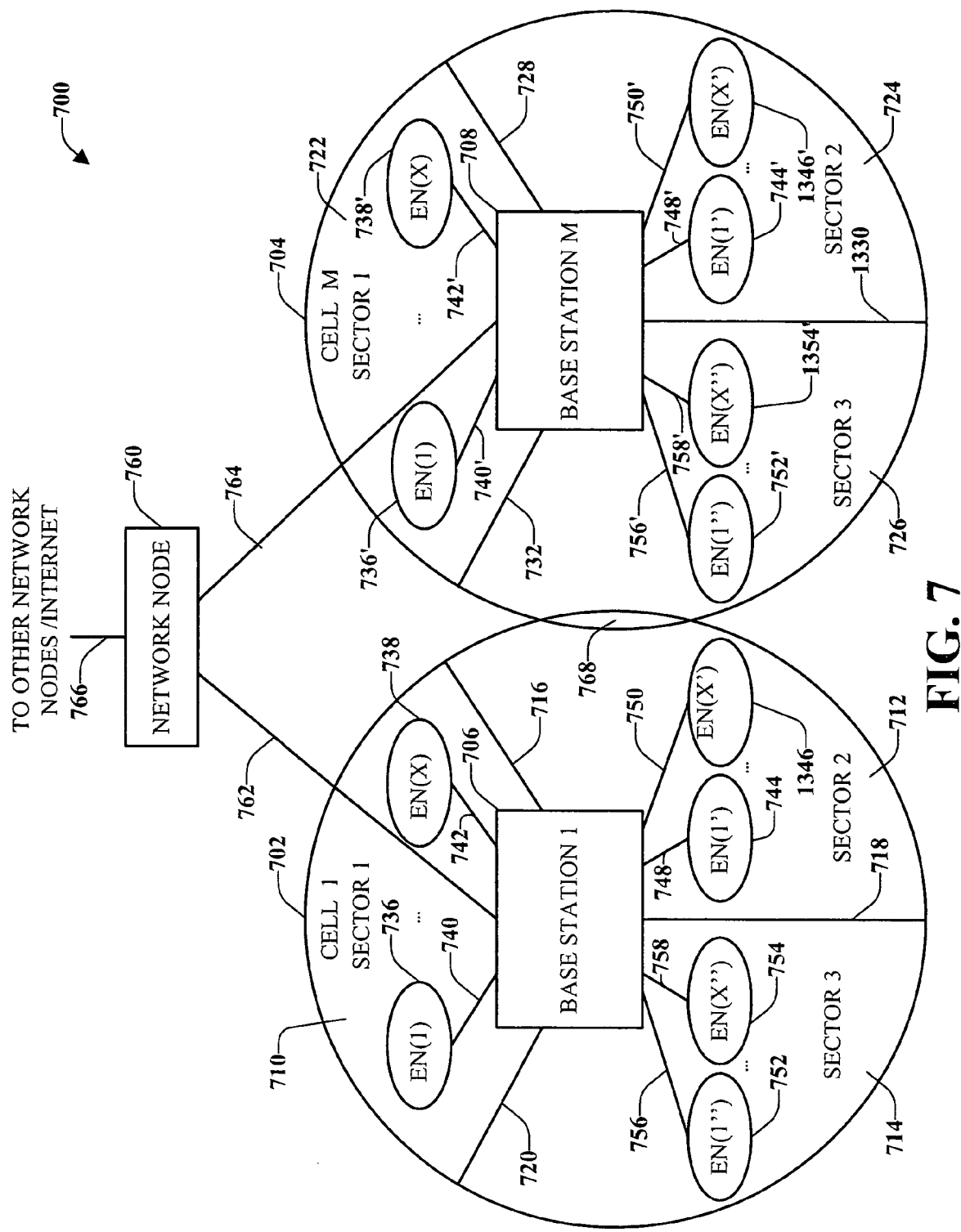
FIG. 7 illustrates a network diagram of an exemplary communications system implemented in accordance with the various embodiments.

FIG. 7 illustrates an exemplary communications system 700 implemented in accordance with the various embodiments. Communications system 700 includes multiple cells, labeled Cell A 702 and Cell G 704, wherein G is an integer greater to or equal to one. Neighboring cells 702, 704 can overlap slightly, as indicated by cell boundary region 768, thereby providing the potential for signal interference between signals being transmitted by base stations in neighboring cells. Each cell 702, 704 of exemplary system 700 includes three sectors. Cells which have not be subdivided into multiple sectors (N=1), cells with two sectors (N=2) and cells with more than 3 sectors (N>3) are also possible in communications system 700. Cell 702 includes a first sector, sector 1 710, a second sector, sector 2 712, and a third sector, sector 3 714. Each sector 710, 712, 714 has two sector boundary regions; each boundary region is shared between two adjacent sectors. Sector boundary regions provide the potential for signal interference between signals being transmitted by base stations in neighboring sectors. Line 716 represents a sector boundary region between sector 1 710 and sector 2 712; line 718 represents a sector boundary region between sector 2 712 and sector 3 714; line 720 represents a sector boundary region between sector 3 714 and sector 1 710. Similarly, cell G 104 includes a first sector, sector 1 722, a second sector, sector 2 724, and a third sector, sector 3 726. Line 728 represents a sector boundary region between sector 1 722 and sector 2 724; line 730 represents a sector boundary region between sector 2 724 and sector 3 726; line 732 represents a boundary region between sector 3 726 and sector 1 722.

Cell 1 702 includes a base station (BS), base station 1 706, and a plurality of end nodes (ENs) in each sector 710, 712, 714. Sector 1 710 includes EN(1) 736 and EN(X) 738 coupled to BS 706 through wireless links 740, 742, respectively; sector 2 712 includes EN(1') 744 and EN(X') 746 coupled to BS 706 through wireless links 748, 750, respectively; sector 3 726 includes EN(1") 752 and EN(X") 754 coupled to BS 706 through wireless links 756, 758, respectively. Similarly, cell M 704 includes base station M 708, and a plurality of end nodes (ENs) in each sector 722, 724, 726. Sector 1 722 includes EN(1) 736' and EN(X) 738' coupled to BS M 708 through wireless links 740', 742', respectively; sector 2 724 includes EN(1') 744' and EN(X') 746' coupled to BS M 708 through wireless links 748', 750', respectively; sector 3 726 includes EN(1") 752' and EN(X") 754' coupled to BS 708 through wireless links 756', 758', respectively.

System 700 also includes a network node 760 which is coupled to BS I 706 and BS G 708 through network links 762, 764, respectively. Network node 760 is also coupled to other network nodes, (e.g., other base stations, AAA server nodes, intermediate nodes, routers, and the like) and the Internet through network link 766. Network links 762, 764, 766 may be, for example, fiber optic cables. Each end node (e.g. EN 1 736) may be a wireless terminal including a transmitter as well as a receiver. The wireless terminals (e.g., EN(1) 736) may move through system 700 and may communicate through wireless links with he base station in the cell in which the EN is currently located. The wireless terminals, (WTs) (e.g. EN(1) 736) may communicate with peer nodes (e.g., other WTs in system 700 or outside system 700) through a base station (e.g., BS 706) and/or network node 760. WTs (e.g., EN(1) 736) may be mobile communications devices such as cell phones, personal data assistants with wireless modems, etc.

Figure 8:
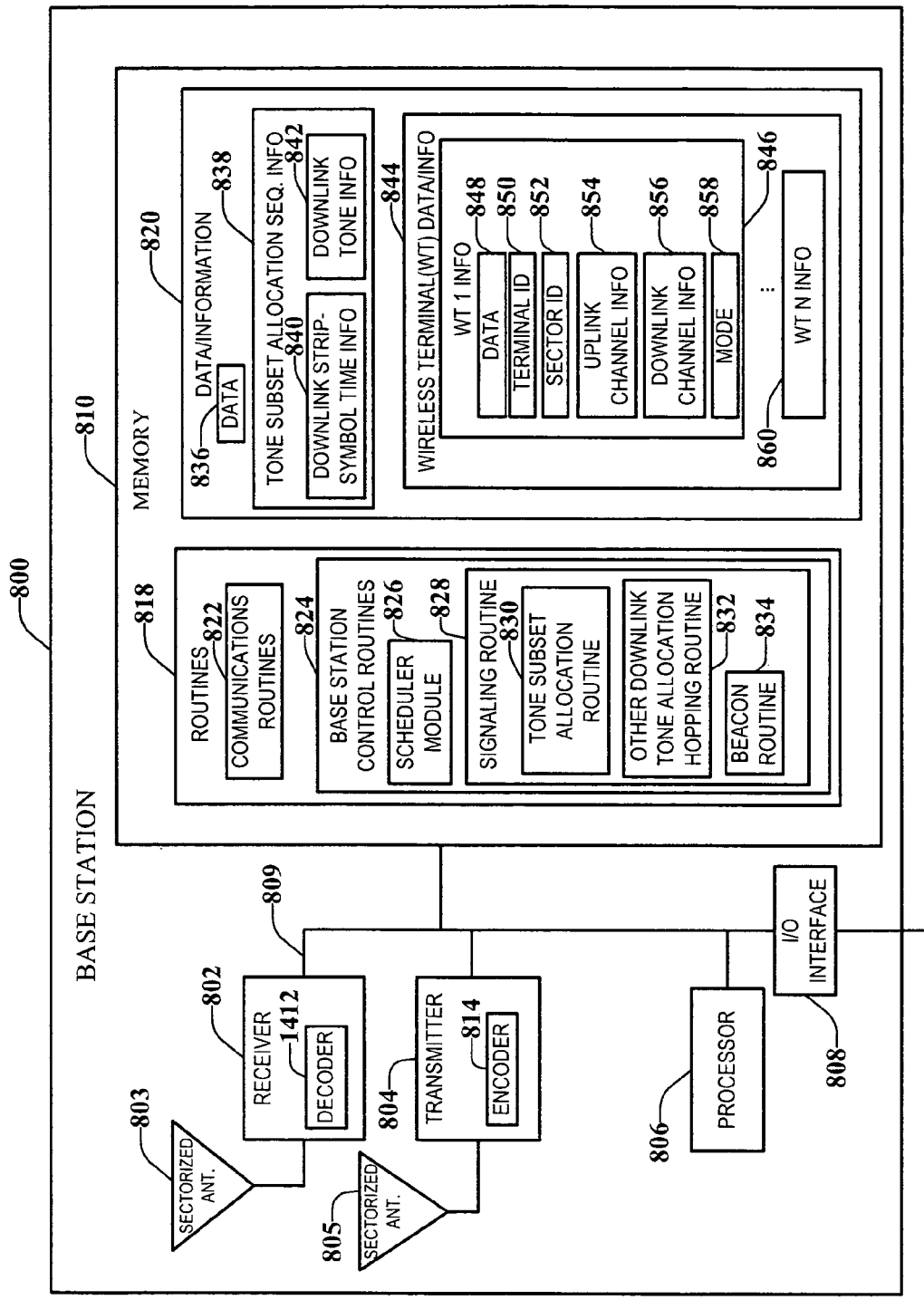
FIG. 8 illustrates an exemplary base station implemented in accordance with the embodiments presented herein.

FIG. 8 illustrates an exemplary base station implemented in accordance with the embodiments presented herein. Exemplary base station 800 can implement a tone subset allocation sequence, with different tone subset allocation sequences generated for each different sector type of the cell. Base station 800 may be used as any one of the base stations 706, 708 of the system 700 of FIG. 7. The base station 800 includes a receiver 802, a transmitter 804, a processor 806, (e.g., CPU), an input/output interface 808 and memory 810 which are coupled by a bus 809 over which the various elements 802, 804, 806, 808, and 810 may interchange data and information.

Sectorized antenna 803 coupled to receiver 802 is used for receiving data and other signals (e.g., state information, access router listing) from wireless terminals transmissions from each sector within the base station's cell. Sectorized antenna 805 coupled to transmitter 804 is used for transmitting data and other signals, (e.g., control signals, pilot signal, beacon signals, etc.) to wireless terminals 900 (see FIG. 9) within each sector of the base station's cell. In various embodiments, base station 800 may employ multiple receivers 802 and multiple transmitters 804, (e.g., an individual receiver 802 for each sector and an individual transmitter 804 for each sector). The processor 806, may be, for example, a general purpose central processing unit (CPU). Processor 806 controls operation of the base station 800 under direction of one or more routines 818 stored in memory 810 and implements the disclosed methodologies. Input/Output (I/O) interface 808 provides a connection to other network nodes, coupling the base station 800 to other base stations, access routers, AAA server nodes, etc., other networks, and the Internet.

Memory 810 includes routines 818 and data/information 820. Data/information 820 includes data 836, tone subset allocation sequence information 838 including downlink strip-symbol time information 840 and downlink tone information 842, and wireless terminal (WT) data/info 844 including a plurality of sets of WT information: WT 1 info 846 and WT N info 860. Each set of WT info, (e.g., WT 1 info 846) includes data 848, terminal ID 850, sector ID 852, uplink channel information 854, downlink channel information 856, and mode information 858.

Routines 818 include communications routines 822 and base station control routines 824. Base station control routines 824 includes a scheduler module 826 and signaling routines 828 including a tone subset allocation routine 830 for the strip-symbol periods, other downlink tone allocation hopping routine 832 for the rest of symbol periods, (e.g., non strip-symbol periods), and a beacon routine 834.

Data 836 includes data to be transmitted that will be sent to encoder 814 of transmitter 804 for encoding prior to transmission to WTs, and received data from WTs that has been processed through decoder 812 of receiver 802 following reception. Downlink strip-symbol time information 840 includes the frame synchronization structure information, such as the superslot, beaconslot, and ultraslot structure information and information specifying whether a given symbol period is a strip-symbol period, and if so, the index of the strip-symbol period and whether the strip-symbol is a resetting point to truncate the tone subset allocation sequence used by the base station. Downlink tone information 842 includes information including a carrier frequency assigned to the base station 800, the number and frequency of tones, and the set of tone subsets to be allocated to the strip-symbol periods, and other cell and sector specific values such as slope, slope index and sector type.

Data 848 may include data that WT1 900 has received from a peer node, data that WT 1 900 desires to be transmitted to a peer node, and downlink channel quality report feedback information. Terminal ID 850 is a base station 800 assigned ID that identifies WT 1 900. Sector ID 852 includes information identifying the sector in which WT1 900 is operating. Sector ID 852 can be used, for example, to determine the sector type. Uplink channel information 854 includes information identifying channel segments that have been allocated by scheduler 826 for WT1 900 to use (e.g., uplink traffic channel segments for data, dedicated uplink control channels for requests, power control, timing control, etc.).

Each uplink channel assigned to WT1 900 includes one or more logical tones, each logical tone following an uplink hopping sequence. Downlink channel information 856 includes information identifying channel segments that have been allocated by scheduler 826 to carry data and/or information to WT1 900 (e.g., downlink traffic channel segments for user data). Each downlink channel assigned to WT1 900 includes one or more logical tones, each following a downlink hopping sequence. Mode information 958 includes information identifying the state of operation of WT1 900, (e.g. sleep, hold, on).

Communications routines 822 control the base station 800 to perform various communications operations and implement various communications protocols. Base station control routines 824 are used to control the base station 800 to perform basic base station functional tasks (e.g., signal generation and reception, scheduling, and to implement the steps of the various methodologies including transmitting signals to wireless terminals using tone subset allocation sequences during the strip-symbol periods.

Signaling routine 828 controls the operation of receiver 802 with its decoder 812 and transmitter 804 with its encoder 814. The signaling routine 828 is responsible controlling the generation of transmitted data 836 and control information. Tone subset allocation routine 830 constructs the tone subset to be used in a strip-symbol period using the disclosed methodologies and data/info 820 including downlink strip-symbol time info 840 and sector ID 852. The downlink tone subset allocation sequences will be different for each sector type in a cell and different for adjacent cells.

The WTs 900 receive the signals in the strip-symbol periods in accordance with the downlink tone subset allocation sequences; the base station 800 uses the same downlink tone subset allocation sequences in order to generate the transmitted signals. Other downlink tone allocation hopping routine 832 constructs downlink tone hopping sequences, using information including downlink tone information 842, and downlink channel information 856, for the symbol periods other than the strip-symbol periods. The downlink data tone hopping sequences are synchronized across the sectors of a cell. Beacon routine 834 controls the transmission of a beacon signal (e.g., a signal of relatively high power signal concentrated on one or a few tones), which may be used for synchronization purposes (e.g., to synchronize the frame timing structure of the downlink signal and therefore the tone subset allocation sequence with respect to an ultra-slot boundary).

Figure 9:
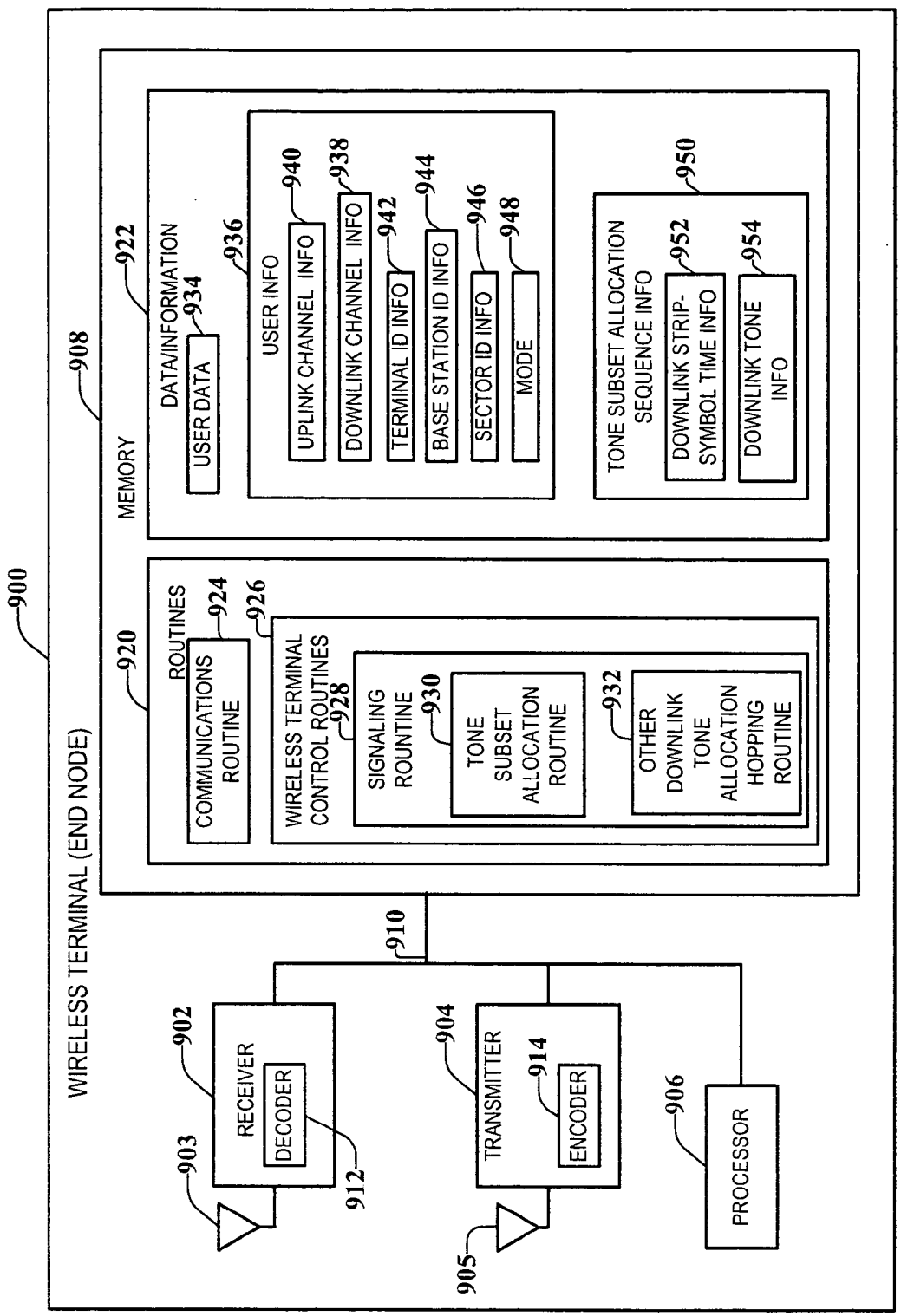
FIG. 9 illustrates an exemplary wireless terminal implemented in accordance with various embodiments presented herein.

FIG. 9 illustrates an exemplary wireless terminal (end node) 900 which can be used as any one of the wireless terminals (end nodes) (e.g., EN(1) 736, of the system 700 shown in FIG. 7. Wireless terminal 900 implements tone subset allocation sequences. The wireless terminal 300 includes a receiver 902 includes a decoder 912, a transmitter 904 including an encoder 914, a processor 906, and memory 908 which are coupled by a bus 910 over which the various elements 902, 904, 906, 908 can interchange data and information. An antenna 903 used for receiving signals from a base station 800 is coupled to receiver 902. An antenna 905 used for transmitting signals (e.g., to base station 800) is coupled to transmitter 904.

The processor 906, (e.g., a CPU) controls the operation of the wireless terminal 900 and implements methods by executing routines 920 and using data/information 922 in memory 908. Data/information 922 includes user data 934, user information 936, and tone subset allocation sequence information 950. User data 934 may include data, intended for a peer node, which will be routed to encoder 914 for encoding prior to transmission by transmitter 904 to base station 800, and data received from the base station 800 which has been processed by the decoder 912 in receiver 902. User information 9336 includes uplink channel information 938, downlink channel information 940, terminal ID information 942, base station ID information 944, sector ID information 946, and mode information 948.

Uplink channel information 938 includes information identifying uplink channels segments that have been assigned by base station 800 for wireless terminal 900 to use when transmitting to the base station 900. Uplink channels may include uplink traffic channels, dedicated uplink control channels (e.g., request channels, power control channels and timing control channels). Each uplink channel includes one or more logic tones, each logical tone following an uplink tone hopping sequence. The uplink hopping sequences are different between each sector type of a cell and between adjacent cells. Downlink channel information 940 includes information identifying downlink channel segments that have been assigned by base station 800 to WT 900 for use when BS 800 is transmitting data/information to WT 900. Downlink channels may include downlink traffic channels and assignment channels, each downlink channel including one or more logical tone, each logical tone following a downlink hopping sequence, which is synchronized between each sector of the cell.

User info 936 also includes terminal ID information 942, which is a base station 800 assigned identification, base station ID information 944 that identifies the specific base station 800 that WT has established communications with, and sector ID info 946, which identifies the specific sector of the cell where WT 800 is presently located. Base station ID 944 provides a cell slope value and sector ID info 946 provides a sector index type; the cell slope value and sector index type may be used to derive the uplink tone hopping sequences. Mode information 948 also included in user info 936 identifies whether the WT 900 is in sleep mode, hold mode, or on mode.

Tone subset allocation sequence information 950 includes downlink strip-symbol time information 952 and downlink tone information 954. Downlink strip-symbol time information 952 include the frame synchronization structure information, such as the superslot, beaconslot, and ultraslot structure information and information specifying whether a given symbol period is a strip-symbol period, and if so, the index of the strip-symbol period and whether the strip-symbol is a resetting point to truncate the tone subset allocation sequence used by the base station. Downlink tone info 954 includes information including a carrier frequency assigned to the base station 800, the number and frequency of tones, and the set of tone subsets to be allocated to the strip-symbol periods, and other cell and sector specific values such as slope, slope index and sector type.

Routines 920 include communications routines 924 and wireless terminal control routines 926. Communications routines 924 control the various communications protocols used by WT 900. Wireless terminal control routines 926 controls basic wireless terminal 900 functionality including the control of the receiver 902 and transmitter 904. Wireless terminal control routines 926 include the signaling routine 928. The signaling routine 928 includes a tone subset allocation routine 930 for the strip-symbol periods and an other downlink tone allocation hopping routine 932 for the rest of symbol periods (e.g., non strip-symbol periods). Tone subset allocation routine 930 uses user data/info 922 including downlink channel information 940, base station ID info 944 (e.g., slope index and sector type), and downlink tone information 954 in order to generate the downlink tone subset allocation sequences and process received data transmitted from base station 800. Other downlink tone allocation hopping routine 930 constructs downlink tone hopping sequences, using information including downlink tone information 954, and downlink channel information 940, for the symbol periods other than the strip-symbol periods. Tone subset allocation routine 930, when executed by processor 906, is used to determine when and on which tones the wireless terminal 900 is to receive one or more strip-symbol signals from the base station 800. The uplink tone allocation hopping routine 930 uses a tone subset allocation function along with information received from the base station 800, to determine the tones in which it should transmit on.

It is to be understood that the embodiments described herein may be implemented by hardware, software, firmware, middleware, microcode, or any combination thereof. When the systems and/or methods are implemented in software, firmware, middleware or microcode, program code or code segments, they may be stored in a machine-readable medium, such as a storage component. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted using any suitable means including memory sharing, message passing, token passing, network transmission, etc.

For a software implementation, the techniques described herein may be implemented with modules (e.g., procedures, functions, and so on) that perform the functions described herein. The software codes may be stored in memory units and executed by processors. The memory unit may be implemented within the processor or external to the processor, in which case it can be communicatively coupled to the processor through various means as is known in the art.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method for combining signals for transmissions, comprising:
   providing a separate winding at a primary side for each tone signal;
   amplifying each tone signal individually according to a hopping sequence;
   combining each amplified signal; and
   outputting the combined signal.

2. The method of claim 1, amplifying each signal individually further comprising applying an individual voltage source to each tone signal.

3. The method of claim 2, the voltage source is a low impedance voltage source.

4. The method of claim 1, the separate winding mitigates coupling between each tone signal.

5. The method of claim 1, combining each amplified signal comprising providing a single winding on a secondary side.

6. The method of claim 1, combining each amplified signal comprising providing a plurality of windings on a secondary side, the plurality of windings are arranged in a series configuration.

7. The method of claim 1, the tone signals are OFDM tone signals.

8. An apparatus that combines signals in an OFDM communication system for transmission, comprising:
   a voltage supply for each OFDM tone signal;
   a separate winding on an input side for each tone signal;
   an amplifier for individually amplifying each tone signal according to a hopping sequence; and
   a winding on a secondary side for coupling the tone signals.

9. The apparatus of claim 8, the voltage supply is a low impedance voltage supply.

10. The apparatus of claim 8, the winding on the secondary side for coupling the tone signals is a single winding.

11. The apparatus of claim 8, the winding on the secondary side for coupling the tone signals is a plurality of windings connected in a series configuration.

12. The apparatus of claim 8 is a component of a base station.

13. The apparatus of claim 8 is a component of a wireless terminal.

14. An apparatus that combines OFDM signals for transmission, comprising:
   means for utilizing a separate winding for each tone signal;
   means for individually amplifying each tone signal according to a hopping sequence;
   means for combining the amplified tone signals; and
   means for transmitting the combined amplified tone signals.

15. The apparatus of claim 14, the means for combining the amplified tone signals further comprising a single winding on a secondary side of a transformer.

16. The apparatus of claim 14, the means for combining the amplified tone signals further comprising a plurality of windings on a secondary side of a transformer, the plurality of windings are arranged in a series configuration.

17. The apparatus of claim 14 is a component of a base station.

18. The apparatus of claim 14 is a component of a wireless terminal.

* * * * *